United States Patent
Hu (10) Patent No.: US 10,629,474 B1
(45) Date of Patent: Apr. 21, 2020

(54) INTEGRATED ISOLATION CAPACITANCE STRUCTURE

(71) Applicant: SEMICONDUCTOR COMPONENTS INDUSTRIES, LLC, Phoenix, AZ (US)

(72) Inventor: YongZhong Hu, Cupertino, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/249,676

(22) Filed: Jan. 16, 2019

(51) Int. Cl.
| | | |
|---|---|---|
| H01L 21/762 | (2006.01) | |
| H01L 29/06 | (2006.01) | |
| H01L 27/108 | (2006.01) | |
| H01L 29/08 | (2006.01) | |
| H01L 27/08 | (2006.01) | |
| H01L 21/76 | (2006.01) | |
| H01L 27/06 | (2006.01) | |
| H01L 49/02 | (2006.01) | |

(52) U.S. Cl.
CPC ........ *H01L 21/76224* (2013.01); *H01L 21/76* (2013.01); *H01L 27/0805* (2013.01); *H01L 27/10829* (2013.01); *H01L 27/10861* (2013.01); *H01L 28/60* (2013.01); *H01L 28/75* (2013.01); *H01L 29/0642* (2013.01); *H01L 29/0847* (2013.01); *H01L 27/0629* (2013.01)

(58) Field of Classification Search
CPC ......... H01L 27/10829; H01L 27/10861; H01L 21/76; H01L 21/76224; H01L 29/0642; H01L 28/60; H01L 28/75; H01L 29/0847; H01L 27/0629; H01L 27/0805
See application file for complete search history.

(56) References Cited

U.S. PATENT DOCUMENTS

| | | | |
|---|---|---|---|
| 10,008,457 B2 | 6/2018 | Burton et al. | |
| 2015/0279844 A1* | 10/2015 | Ho | H01L 21/76264 257/301 |
| 2017/0221901 A1* | 8/2017 | Baskaran | H01L 27/0629 |

OTHER PUBLICATIONS

U.S. Appl. No. 16/102,910, filed Aug. 24, 2018, Syed Enam Rehman et al., "Circuits and Methods for Bi-Directional Data Communication Over Isolation Channels," 43 pages.
Pushpa Mahalingam et al., "Manufacturing challenges and method of fabrication of on chip capacitive digital isolators," ISSM Paper: PO-P-020, IEEE, 2007, 4 pages.
Silicon Labs, Si864x Data Sheet, Rev. 2.12, Feb. 2018, 44 pages.

* cited by examiner

*Primary Examiner* — Thanhha S Pham
(74) *Attorney, Agent, or Firm* — Ramey & Schwaller, LLP (57) ABSTRACT

Various capacitive isolation structures which can be readily incorporated into existing IC manufacturing procedures. An illustrative method embodiment for forming an isolation capacitance includes: (a) forming a recess on a surface of an integrated circuit substrate, the recess having a bottom surface; (b) coating the bottom surface with an insulating layer; (c) overlaying a bottom electrode on the insulating layer; (d) filling the recess with a bulk insulator having a minimum thickness no less than half a depth of the recess; and (e) depositing a top electrode above the bulk insulator.

20 Claims, 5 Drawing Sheets

FIG. 7

INTEGRATED ISOLATION CAPACITANCE STRUCTURE

BACKGROUND

An integrated circuit designer may often need to provide DC isolation between electronic components of a system. For example, a power converter may include power MOSFETs and other components designed for higher voltages and current loads, as well as small feature-size CMOS logic gates designed for fast control operations with minimal quiescent currents. As another example, telecommunications equipment may have sensitive receiver electronics coupled to signal lines or antennas that are susceptible to high voltage transients. As yet another example, medical monitoring systems may have sensors and leads attached to patients who must be protected from any electrical faults.

Existing galvanic isolation techniques employ capacitors, transformers, magnetoresistive couplers, and optoisolators, but are each believed to offer insufficient reliability, excessive propagation delay, excessive bulk, excessive attenuation, and/or excessive manufacturing complexity.

SUMMARY

Accordingly, there are disclosed herein various novel capacitor structures suitable for galvanic isolation and which can be readily incorporated into existing IC manufacturing procedures without suffering the shortcomings of existing techniques. An illustrative method embodiment for forming an isolation capacitance includes: (a) forming a recess on a surface of an integrated circuit substrate, the recess having a bottom surface; (b) coating the bottom surface with an insulating layer; (c) overlaying a bottom electrode on the insulating layer; (d) filling the recess with a bulk insulator having a minimum thickness no less than half a depth of the recess; and (e) depositing a top electrode above the bulk insulator.

An illustrative isolation capacitor embodiment includes: (a) a recess on a surface of an integrated circuit substrate, the recess having a bottom surface at a depth below the surface of the integrated circuit substrate; (b) an insulating layer coating the bottom surface; (c) a bottom electrode overlaying the insulating layer; (d) a bulk insulator filling the recess above the bottom electrode, the bulk insulator having a minimum thickness no less than half of said depth; and (e) a top electrode deposited above the bulk insulator.

Each of the foregoing embodiments may be employed together with any one or more of the following features in any suitable combination: 1. the minimum thickness is no less than eighty percent of the depth of the recess. 2. the minimum thickness is no less than the depth of the recess. 3. the recess has at least one side wall coated with the insulating layer and overlaid by a sidewall portion of the bottom electrode. 4. the top electrode is separated from the sidewall portion of the bottom electrode by no less than the minimum thickness. 5. the minimum thickness is 10 microns or more. 6. the recess has at least one flat, inclined corner surface coated with the insulating layer and overlaid by a corner portion of the bottom electrode. 7. the top electrode is separated from the corner portion by no less than the minimum thickness. 8. prior to said forming, creating at least one transistor having a body well, a source region, a drain region, a gate dielectric, a gate, and an overlying dielectric layer. 9. prior to said depositing, patterning a metallization layer to provide: an interconnect coupled to the at least one transistor; and a bottom electrode interconnect that connects to the bottom electrode. 10. prior to said depositing: protecting the metallization layer with an interlayer dielectric; and planarizing the interlayer dielectric. 11. depositing the top electrode comprises patterning a metallization layer that includes the top electrode and a pin pad. 12. the substrate includes at least one transistor having a body well, a source region, a drain region, a gate dielectric, a gate, and an overlying dielectric layer. 13. the substrate has a patterned metallization layer that includes: an interconnect coupled to the at least one transistor; and a bottom electrode interconnect that connects to the bottom electrode. 14. a planarized interlayer dielectric overlying the patterned metallization layer and the bulk insulator. 15. the top electrode is part of a second metallization layer overlying the planarized interlayer dielectric.

It should be understood that the drawings and corresponding detailed description do not limit the disclosure, but on the contrary, they provide the foundation for understanding all modifications, equivalents, and alternatives falling within the scope of the appended claims.

DETAILED DESCRIPTION

Figure 1:
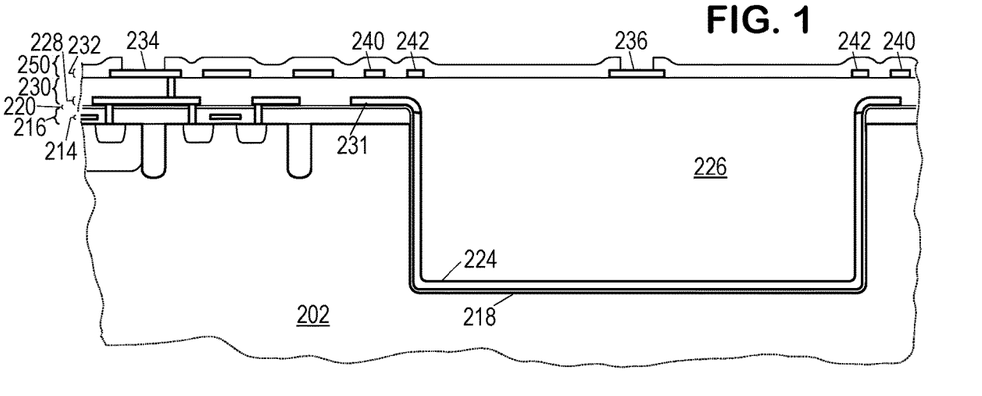
FIG. 1 is a cross-section of a first illustrative isolation capacitance structure.

An integrated circuit module may be galvanically isolated from another on-chip module or, more preferably, from an off-chip module while communicating via an isolation structure. FIG. 1 shows an illustrative isolation structure that operates as a capacitor to pass nonzero frequency components of an analog or digital signal. One such isolation capacitor may be used in each signal line for communicating between galvanically isolated circuit modules; thus two such isolation capacitors are employed for each differential signal.

The illustrative isolation structure may be integrated on-chip with the integrated circuit module, and as discussed herein the manufacturing process for the isolation structure may be readily incorporated into the process for manufacturing the integrated circuit module on its substrate 202. The finished isolation structure includes a recess 218 in the substrate 202 with a bottom electrode 224 and a top electrode 236 separated by a bulk insulator 226. To reach the finished isolation structure of FIG. 1, a manufacturing process is employed as discussed here with reference to FIGS. 2A-2E.

Figure 2A:
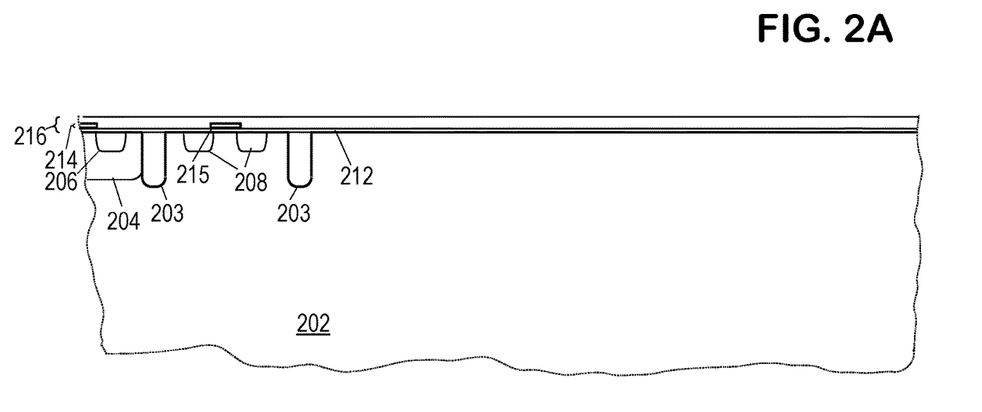
FIGS. 2A-2E are cross-sections of intermediate structures created while manufacturing the first illustrative isolation capacitance structure.

FIG. 2A is a cross-section of an illustrative semiconductor substrate 202, typically a wafer of lightly-doped silicon, after standard processing steps have been applied to form shallow trenches 203, body wells 204, source and drain implants 206, 208, a gate dielectric layer 212, a gate layer 214, and a first interlayer dielectric ("ILD0") layer 216. The trenches 203 may be formed using existing STI ("shallow trench isolation") or LOCOS ("local oxidation of silicon") techniques. Body wells may be provided via existing implant and annealing techniques, or via alternatives such as diffusion or epitaxial layer deposition techniques. Similarly gates, spacers, sources, drains, and other MOS transistor components may be created using existing techniques. A CMP (chemical-mechanical polishing) process may be applied to provide the ILD0 layer 216 with a planar upper surface. These processing steps may be the standard "front end" process for any existing MOS-compatible processing technology, and there is no implication intended that it is necessary for the integrated devices to have the illustrated design. Rather, FIG. 2A is intended to show a suitable processing stage at which steps may be added to create the disclosed isolation structure.

Figure 2B:
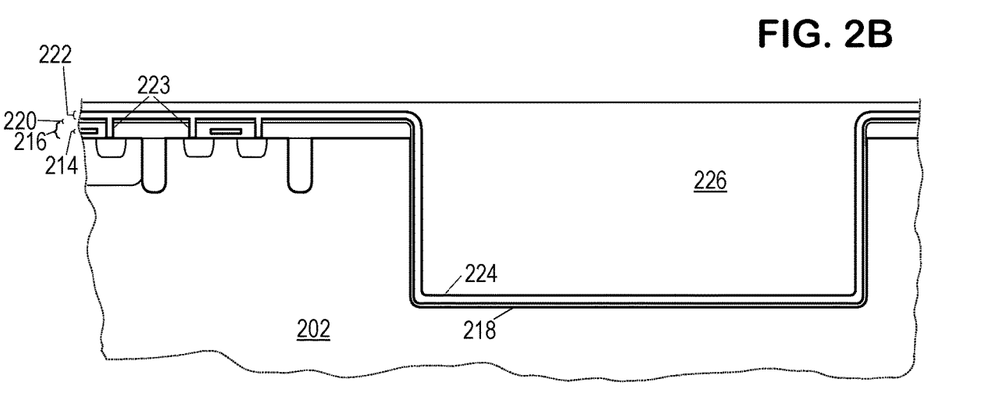

To achieve the intermediate structure shown in FIG. 2B, an etch-stop layer, such as a 1000 angstrom thick PECVD (plasma-enhanced chemical vapor deposited) silicon nitride film, is applied over the surface of the ILD0 layer 216. Over the etch-stop layer, a patterned photo mask ("deep trench mask") is provided to define apertures where recesses (such as recess 218) are desired. A first etch process is applied to remove the silicon nitride coating exposed by the apertures in the deep trench mask and the underlying portions of the ILD0 layer 216. The mask may be stripped before a deep and wide silicon etch process is applied to create the recess 218. The depth of the recess is chosen based on the desired level of voltage isolation. A standard "RCA clean" process is then applied to remove any organic contaminants, surface oxides, and ionic contaminants, before a new cap layer 220 is deposited.

The cap layer 220 may be a PECVD silicon nitride, an oxide, or some other suitable insulating material sufficient for electrically isolating the substrate 202 from a bottom electrode 224. In some contemplated embodiments, the cap layer 220 is about 1000 Å thick. Such a cap layer is routinely provided as part of the standard manufacturing process. Thereafter, a patterned photo mask is created to define apertures for source, drain, and gate contacts 223. An etch process is applied to remove the exposed cap layer and underlying portions of the ILD0 layer 216. A blanket contact CVD layer 222 may include a contact barrier layer (e.g., Ti/TiN or TaN) and a contact material (e.g., W) deposited about 6000 Å thick to form the contacts 223 and the isolation structure's bottom electrode 224. Note that the cap layer 220 and bottom electrode 224 also extend up the sidewalls of the recess 218.

The recess 218 is then filled with a bulk insulator 226. The trench fill process can be performed in a number of ways. As a first example, the bulk insulator 226 may be provided by a spin-on-glass (SOG) or spin-on-polymer (e.g., polyimide, polybenzoxazole, benzo cyclobutene) using a coating and curing/sintering process. While such processes are well known and understood, care should be taken to prevent voids and adequately account for outgassing and film stress in a fashion that assures dielectric strength of the bulk insulator. Thus it may be necessary to build up the bulk insulator 226 from sublayers applied in multiple steps, particularly for recesses deeper than about 50 microns.

Figure 2C:
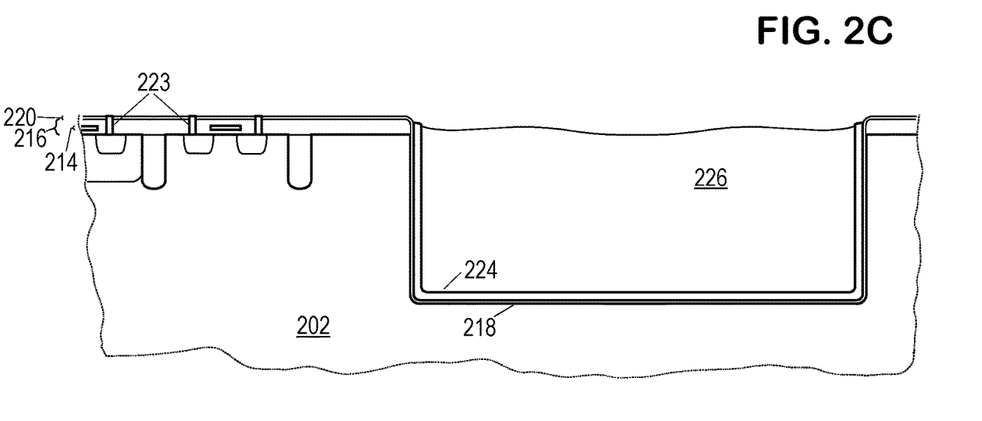

FIG. 2C shows the intermediate structure after a CMP process is applied to remove the bulk insulator from the surface as well as the blanket contact layer 222. If erosion of bulk insulator 226 from the recess 218 is a concern, the intermediate structure of FIG. 2C may be obtained by first applying a reverse photoresist mask to cover the recess, then applying an etch process to remove the SOG from the surface around the recess. The reverse mask may then be stripped and a tungsten etchback process used to remove the contact layer 222, leaving just the contacts 223, the bottom electrode 224, and the bulk insulator 226 within the recess 218.

Once the structure of FIG. 2C has been obtained, the remaining "back end" processing steps may be applied in the standard existing fashion to complete the manufacture of the integrated circuit chip.

Figure 2D:
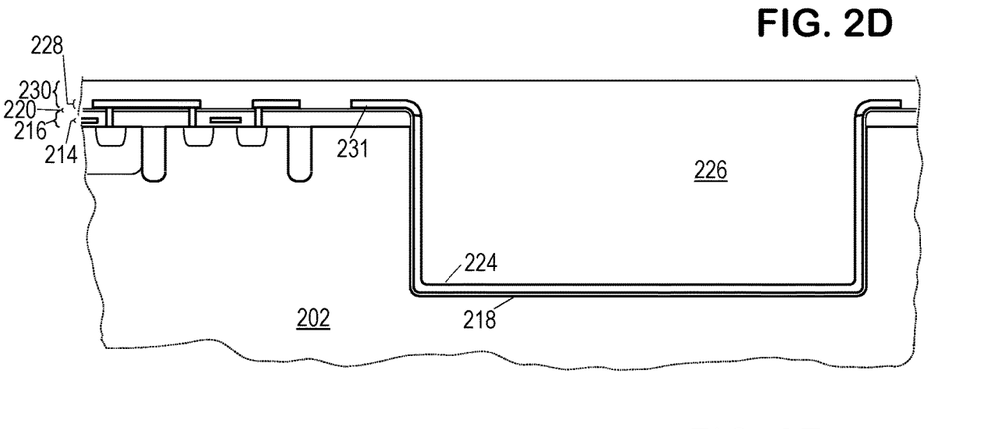

FIG. 2D shows the intermediate structure after creation of a metal layer ("Metal1") 228 and another intermetal dielectric layer ("IMD1") 230. Metal1 layer 228 may be created with a blanket deposition of a metal layer, followed by a photoresist mask which is exposed to light to protect the areas where the metal should be kept. An etch process may be applied to remove the unexposed photoresist and the underlying metal, before the exposed photoresist is stripped off, leaving the desired metal conductors 228. In FIG. 2D, the metal layer 228 includes a trace 231 that connects to the bottom electrode 224. Trace 231 may connect to the input of an integrated circuit amplifier or other sensor for detecting signals received via the isolation structure. Alternatively, or in addition, trace 231 may connect to the output of an integrated circuit amplifier or other driver for transmitting signals via the isolation structure. The IMD layer 230 is deposited in a standard fashion.

Figure 2E:
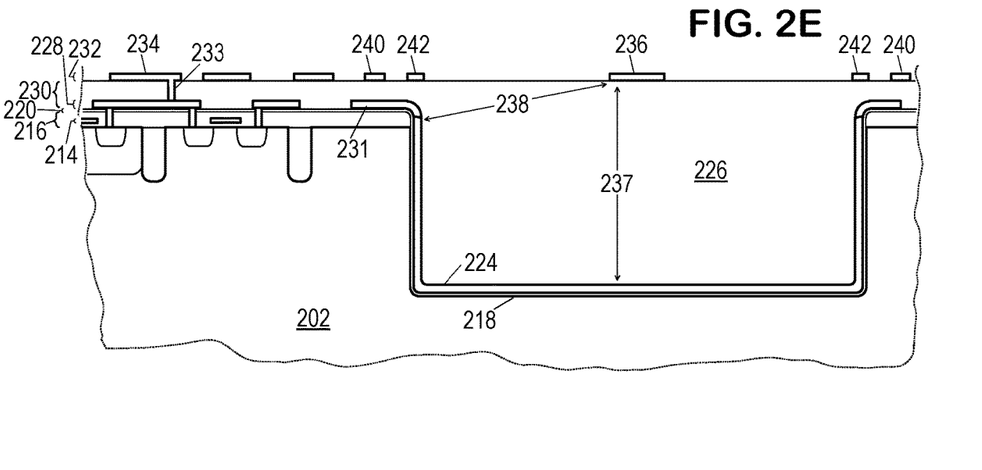

FIG. 2E shows the intermediate structure after creation of vias 233 and a second metal layer ("Metal2") 232. The vias and metal conductors are patterned and deposited in the standard fashion. Among the conductors illustrated in the Metal2 layer 232 of FIG. 2E are a contact pad 234, the isolation structure's top electrode 236, a termination ring 240, and one or more optional floating rings 242. The top electrode 236 is separated from the bottom electrode 224 by a distance 237 which is chosen to provide the bulk insulator 226 with a breakdown voltage equal to or greater than the desired isolation voltage. Note that the top electrode 236 is also separated from the sidewalls of the bottom electrode 224 by a distance 238, which should be no smaller than the vertical distance 237.

Termination ring 240 may be grounded or otherwise held at a fixed voltage to limit the spread of the electromagnetic fields created in the isolation structure. Floating ring(s) 242 may optionally be provided as part of the design to further control the isolation structure's electromagnetic field distribution and gradient.

The finished structure of FIG. 1 is obtained from the intermediate structure of FIG. 2E by the provision of a passivation layer 250 with apertures for connections to the contact pads such as pad 234. Top electrode 236 may also serve as a contact pad for connection to an off-chip module that is to be galvanically isolated from the on-chip circuitry. Though not shown here, bond wires may be soldered to the contact pads to connect the pads to a pin frame or other components of a multi-chip module. Thereafter the chip may be packaged in the usual fashion.

If spin-on-glass is used as the bulk insulator 226, a 20 kV isolation voltage specification may be achieved with a recess depth of 30 to 40 microns and a horizontal separation 238 of 40 microns. Designs for 10 kV and 5 kV isolation voltages may be proportionately smaller. The lateral dimensions of the recess are determined by the desired capacitance of the isolation structure.

The illustrative embodiment of FIG. 1 employs the Metal1 layer 228 for connecting to the bottom electrode 224 and the Metal2 layer 232 for forming the top electrode 236. Other options also exist.

Figure 3:
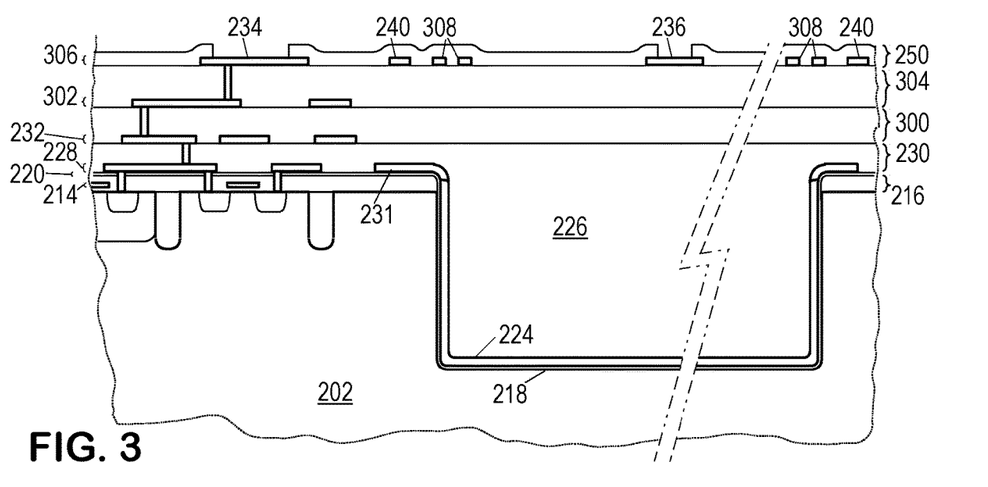
FIG. 3 is a cross-section of an illustrative isolation capacitance structure with an M4 top electrode.

The illustrative embodiment of FIG. 3 includes additional layers, namely: a second intermetal dielectric layer ("IMD2") 300, a Metal3 layer 302, a third intermetal dielectric layer ("IMD3") 304, and a Metal4 layer 306 topped by the passivation layer 250. In this embodiment, the top electrode 236, termination ring 240, and one or more optional floating rings 308, are formed as part of the Metal4 layer 306. Vias may be used to connect the metal layers in the usual fashion. With the additional layers, the top electrode 236 may be raised about 3 microns above the substrate surface, potentially reducing the required etch depth for the recess 218.

Figure 4:
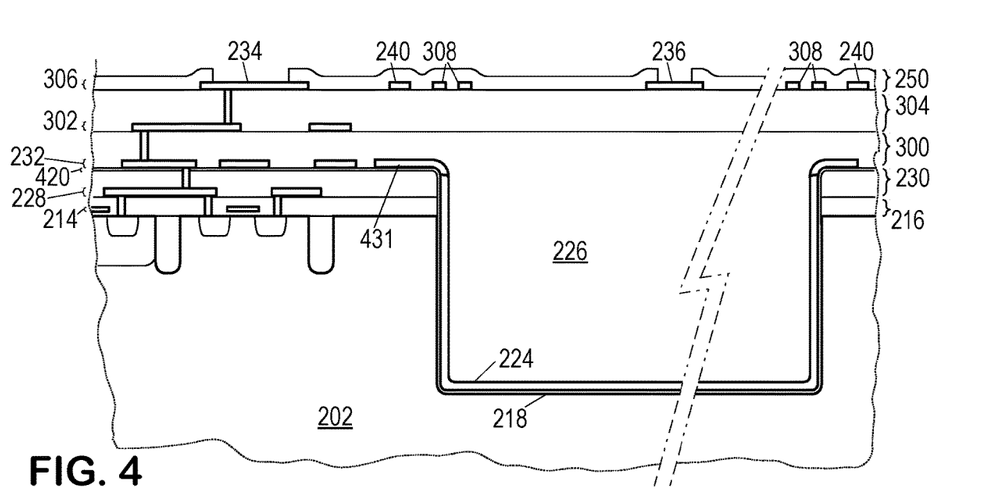
FIG. 4 is a cross-section of an illustrative isolation capacitance structure with an M2-connected bottom electrode.

The illustrative embodiment of FIG. 4 includes the additional layers provided in FIG. 3, though the cap layer 220 becomes a cap layer 420 over the IMD1 layer 230, and the previous connection 231 for the bottom electrode 224 is omitted in favor of a connection 431 which is formed as part of a higher metal layer. In FIG. 4, bottom electrode connection 431 is formed as part of the Metal2 layer 232. The use of a higher metal layer may be a matter of design preference, and the bottom electrode connection may be formed as part of any metal layer (including the gate layer 214 if a suitable gate material is used).

The foregoing embodiments have employed a deep trench silicon etch, which provides a fairly uniform recess depth. In the following embodiments, a crystalline silicon alkaline etch (also known as a facet etch or an anisotropic wet etch) is employed as an ultra low cost alternative to the deep trench silicon etch. Such alkaline etching may be performed using, e.g., potassium hydroxide, tetramethyl ammonium hydroxide, or ethylenediamine pyrocatecol. (For some manufacturing processes where KOH is a concern, the TMAH or EDP options may be employed instead). When applied to a silicon substrate having a <100> orientation, anisotropic etches produce corner surfaces along the <111> plane, i.e., at a 54.74° angle from the substrate surface.

Figure 5:
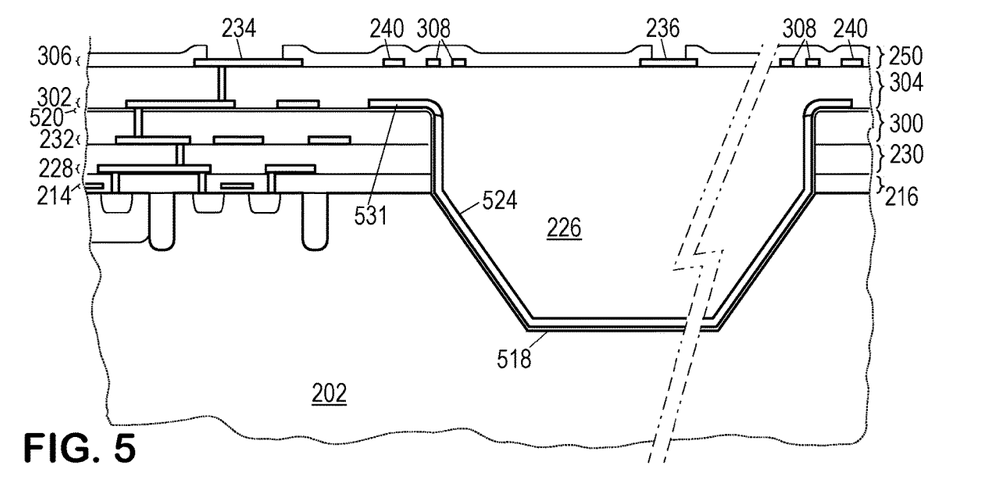
FIG. 5 is a cross-section of an illustrative isolation capacitance structure with an anisotropic-etched recess.

The illustrative embodiment of FIG. 5 includes a recess 518 formed by an anisotropic etch. The layers of FIG. 3 and FIG. 4 are also present in FIG. 5, though the cap layer 520 is now provided over the IMD2 layer 300 and the bottom electrode connection 531 is formed as part of the Metal3 layer 302. As with FIG. 4, the top electrode is formed from the Metal4 layer 306. The required separation of the top electrode 236 from the bottom electrode 524 should be enforced for the each of the bottom surface, corner surface, and sidewall surfaces.

Figure 6:
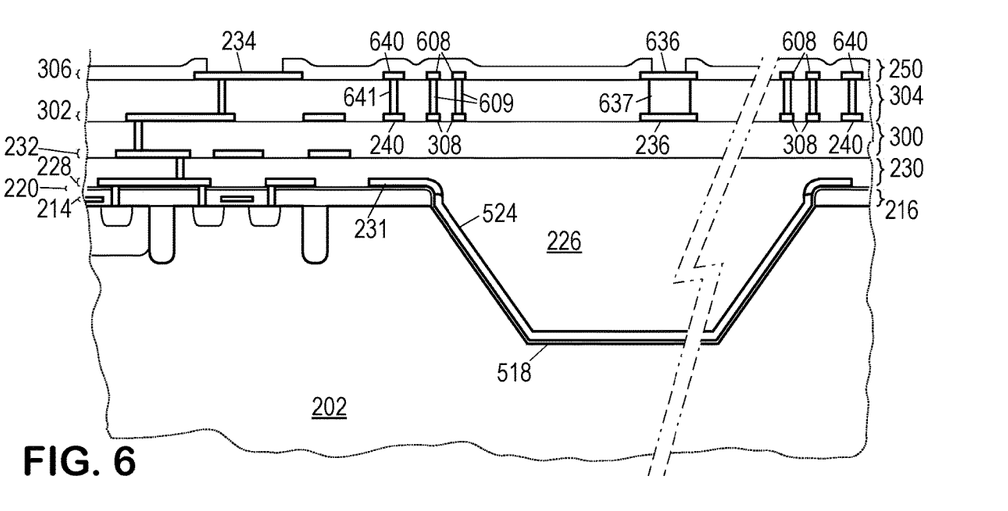
FIG. 6 is a cross-section of an illustrative isolation capacitance structure with a robustly-metalized top electrode.

The illustrative embodiment of FIG. 6 includes the recess 518 formed by an anisotropic etch. The cap layer 220 is provided over the ILD0 layer 216 and the bottom electrode connection 231 is provided as part of the Metal1 layer 228. The top electrode 236, termination ring 240, and optional floating ring(s) 308 are provided as part of the Metal3 layer 302, and are each connected to corresponding conductors in the Metal4 layer 306. Thus, top electrode 236 is connected by a wide via 637 to a pin pad 636, providing a more robust pad for improved wire bonding integrity. Termination ring 240 is connected by a via ring 641 to a termination ring 640, while floating rings 308 are connected by via rings 609 to floating rings 608 in the Metal4 layer. Extending the termination and floating rings in this manner may maintain their effectiveness at controlling the field distributions around the top electrode 236.

It is noted here that the field distribution in the anisotropically etched recess 518 may be more uniform than that in the "deep trench" etched recesses 218, and may consequently provide a higher capacitance in a smaller footprint.

Figure 7:
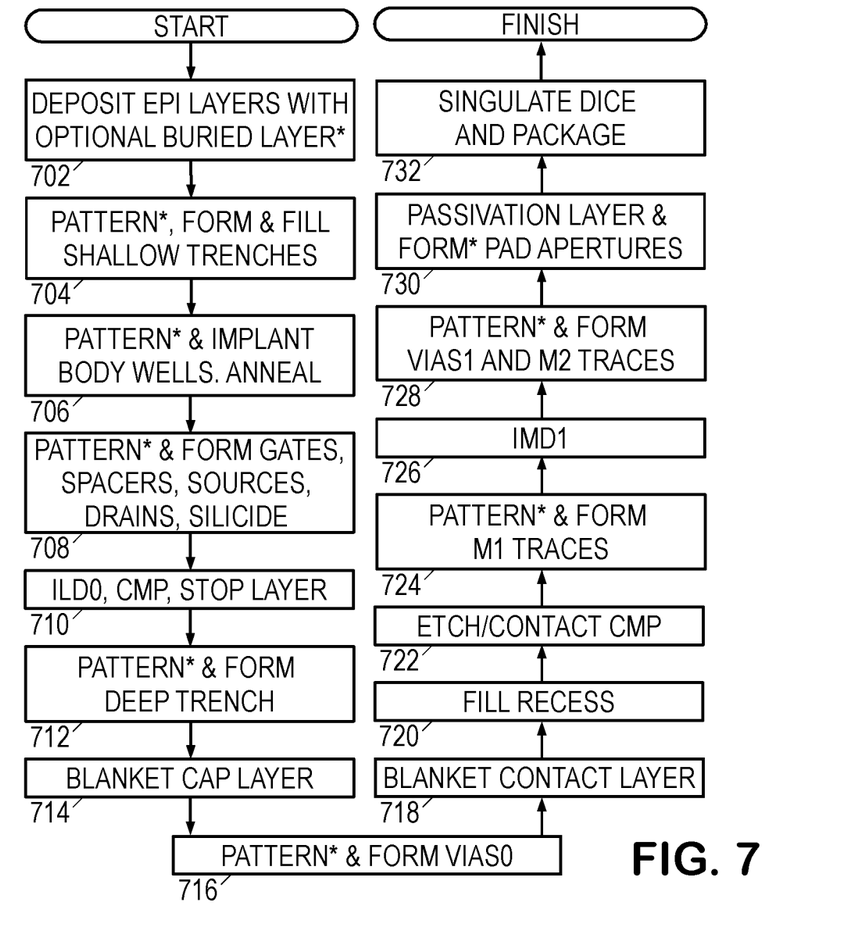
FIG. 7 is a flow diagram of a method for forming an isolation capacitance.

FIG. 7 is a flow diagram of an illustrative manufacturing process for forming an integrated circuit with an on-chip isolation capacitance. It begins in block 702 with the optional deposition of any desired epitaxial layers including optional buried layers for protecting against undesired body current. Asterisks in FIG. 7 denote the use of a patterning operation typically involving the use of a photoresistive layer which is exposed to a pattern of light to define areas to be removed or retained before or after materials are etched, implanted, or deposited, after which the photoresistive layer is stripped away. Typically there are multiple well-understood patterning techniques available for use, and those skilled in the art will recognize that any suitable technique can be used without significantly impacting the final device structure.

In block 704, the manufacturing process optionally includes patterning, forming, and filling shallow trenches for STI ("shallow trench isolation") to minimize interaction between closely-spaced devices. In block 706, doping is performed for device body wells, including patterning of photoresist to define apertures through which dopant implantation occurs. Typically an annealing step is performed to diffuse the dopants and remediate any damage to the crystalline structure of the substrate.

In block 708, the manufacturing process provides patterning and formation of gate dielectrics and gates, optional creation of spacers, and formation of self-aligned sources and drains. Silicide (a compound of silicon and a metal) may be formed over the gate, source, and drain regions to reduce contact resistance with metal traces. In block 710, a first dielectric layer (ILD0) is formed, planarized and coated with an etch-stop layer. In block 712, recesses are patterned and formed for the isolation structures using a deep trench etch process or an anisotropic etch process. In block 714, a blanket cap layer is formed to, among other things, isolate the bottom electrode from the substrate. In block 716, vias are patterned and formed through the ILD0 layer, and filled in block 718 with a blanket contact material (e.g., tungsten) that also serves as a bottom electrode for the isolation structure(s). In block 720, a bulk insulator is provided to fill the recess. In block 722, an etch process and CMP process are applied to remove the bulk insulator and the blanket contact material from the surface of the substrate while preserving their presence within the recesses. In block 724, the Metal1 traces are patterned and formed. In block 726, the IMD1 dielectric layer is formed. In block 728, vias through the IMD1 layer are patterned, formed, and filled, before the Metal2 layer is patterned and formed. In block 730, a passivation layer is deposited, with apertures formed for the pin pads. In block 732, the substrate is singulated to provide dice which can then be wire bonded to pin frames and packaged as integrated circuit chips.

The foregoing structures and methods enable on-chip isolation with minimal modification of existing manufacturing processes, i.e., the insertion of one or two mask and process modules after an ILD or IMD CMP step to form and fill the recess, which steps will not impact the existing front end or back end processes. Inserted modules are low cost and low risk. The isolation structures are scalable to the desired isolation voltage specification, and are portable to any manufacturing technology currently being used for controller devices, gate drivers, transmitters, and receivers. Notably, the inclusion of the isolation structures requires no additional layers beyond what are already employed by the existing processes for manufacturing the devices of interest. The structure is very flexible, enabling any two existing metal layers to be employed for providing the top electrode and coupling to the bottom electrode.

It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) are reasonable variances from the ideal goal of exactly as described.

The terms first, second, third and the like in the claims or/and in the Detailed Description, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, while some embodiments described herein include some but not other features included in other embodiments, combinations of features of different embodiments are meant to be within the scope of the invention, and form different embodiments, as would be understood by those skilled in the art. Inventive aspects may lie in less than all features of a single foregoing disclosed embodiment.

These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A method for forming an isolation capacitance, comprising:
   forming a recess on a surface of an integrated circuit substrate, the recess having a bottom surface;
   coating the bottom surface with an insulating layer;
   overlaying a bottom electrode on the insulating layer;
   filling the recess with a bulk insulator having a minimum thickness no less than half a depth of the recess; and
   depositing a top electrode above the bulk insulator.
2. The method of claim 1, wherein the minimum thickness is no less than eighty percent of the depth of the recess.
3. The method of claim 1, wherein the minimum thickness is no less than the depth of the recess.
4. The method of claim 1, wherein the recess has at least one side wall coated with the insulating layer and overlaid by a sidewall portion of the bottom electrode, and wherein the top electrode is separated from the sidewall portion of the bottom electrode by no less than the minimum thickness.
5. The method of claim 4, wherein the minimum thickness is 10 microns or more.
6. The method of claim 1, wherein the recess has at least one flat, inclined corner surface coated with the insulating layer and overlaid by a corner portion of the bottom electrode, and wherein the top electrode is separated from the corner portion by no less than the minimum thickness.
7. The method of claim 1, further comprising, prior to said forming: creating at least one transistor having a body well, a source region, a drain region, a gate dielectric, a gate, and an overlying dielectric layer.
8. The method of claim 7, further comprising, prior to said depositing, patterning a metallization layer to provide:
   an interconnect coupled to the at least one transistor; and
   a bottom electrode interconnect that connects to the bottom electrode.
9. The method of claim 8, further comprising, prior to said depositing:
   protecting the metallization layer with an interlayer dielectric; and
   planarizing the interlayer dielectric.
10. The method of claim 9, wherein depositing the top electrode comprises patterning a metallization layer that includes the top electrode and a pin pad.
11. An isolation capacitor that comprises:
    a recess on a surface of an integrated circuit substrate, the recess having a bottom surface at a depth below the surface of the integrated circuit substrate;
    an insulating layer coating the bottom surface;
    a bottom electrode overlaying the insulating layer;
    a bulk insulator filling the recess above the bottom electrode, the bulk insulator having a minimum thickness no less than half of said depth; and
    a top electrode deposited above the bulk insulator.
12. The isolation capacitor of claim 11, wherein the minimum thickness is no less than eighty percent of the depth of the recess.
13. The isolation capacitor of claim 11, wherein the minimum thickness is no less than the depth of the recess.
14. The isolation capacitor of claim 11, wherein the recess has at least one side wall coated with the insulating layer and overlaid by a sidewall portion of the bottom electrode, and wherein the top electrode is separated from the sidewall portion of the bottom electrode by no less than the minimum thickness.
15. The isolation capacitor of claim 14, wherein the minimum thickness is 10 microns or more.
16. The isolation capacitor of claim 11, wherein the recess has at least one flat, inclined corner surface coated with the insulating layer and overlaid by a corner portion of the bottom electrode, and wherein the top electrode is separated from the corner portion by no less than the minimum thickness.
17. The isolation capacitor of claim 11, wherein the substrate includes at least one transistor having a body well, a source region, a drain region, a gate dielectric, a gate, and an overlying dielectric layer.
18. The isolation capacitor of claim 17, wherein the substrate has a patterned metallization layer that includes:
    an interconnect coupled to the at least one transistor; and
    a bottom electrode interconnect that connects to the bottom electrode.

19. The isolation capacitor of claim 18, further including a planarized interlayer dielectric overlying the patterned metallization layer and the bulk insulator.

20. The isolation capacitor of claim 19, wherein the top electrode is part of a second metallization layer overlying the planarized interlayer dielectric.

* * * * *